(12) United States Patent
Ose et al.

(10) Patent No.: US 7,075,078 B2
(45) Date of Patent: *Jul. 11, 2006

(54) SCANNING ELECTRON MICROSCOPE

(75) Inventors: Yoichi Ose, Mito (JP); Hideo Todokoro, Nishitama-gun (JP); Makoto Ezumi, Mito (JP); Mitsugu Sato, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/064,819

(22) Filed: Feb. 25, 2005

(65) Prior Publication Data

US 2005/0139773 A1 Jun. 30, 2005

Related U.S. Application Data (63) Continuation of application No. 10/817,834, filed on Apr. 6, 2004, now Pat. No. 6,885,001, which is a continuation of application No. 09/768,356, filed on Jan. 25, 2001, now Pat. No. 6,787,772.

(30) Foreign Application Priority Data

Jan. 25, 2000 (JP) .............................. 2000-17991

(51) Int. Cl.
*G01N 23/00* (2006.01)
*G21K 7/00* (2006.01)

(52) U.S. Cl. .................. 250/311; 250/306; 250/396 R; 250/396 ML; 250/492.3

(58) Field of Classification Search ................ 250/306, 250/307, 309–311, 397, 396 R, 396 ML, 250/492.3
See application file for complete search history.

(56) References Cited

U.S. PATENT DOCUMENTS

| | | | |
|---|---|---|---|
| 4,151,418 A | * | 4/1979 | Kenessey ............... 250/442.11 |
| 4,769,543 A | | 9/1988 | Plies |
| 4,943,722 A | | 7/1990 | Breton et al. |
| 5,412,209 A | * | 5/1995 | Otaka et al. ................ 250/310 |

(Continued)

FOREIGN PATENT DOCUMENTS

JP  56-50051  5/1981

(Continued)

OTHER PUBLICATIONS

"MOL (Moving Objective Lens) Formulation of Deflective Aberration Free System". *OPTIK*, Eiichi Goto and Takasji Somo, 48 (1977) No. 3, pp. 255-270.

*Primary Examiner*—John R. Lee
*Assistant Examiner*—Bernard E. Souw
(74) *Attorney, Agent, or Firm*—McDermott Will & Emery LLP (57) ABSTRACT

A disclosed scanning electron microscope (SEM) is intended to prevent deterioration of resolution due to increase in off-axis aberration resulting from a deviation of a primary electron bean from the optical axis of the microscope. An example of the SEM has an image shifting deflector system including two deflectors disposed respectively at upper and lower stages. The deflector at the lower stage is a multipole electrostatic deflecting electrode and is disposed in an objective. Even if the distance of image shifting is great, an image of a high resolution can be formed, and dimensions can be measured in a high accuracy. The SEM is able to achieve precision inspection at a high throughput when applied to inspection in semiconductor device fabricating processes that process a wafer having a large area and provided with very minute circuit elements.

12 Claims, 10 Drawing Sheets

U.S. PATENT DOCUMENTS

| | | | |
|---|---|---|---|
| 5,872,358 A | 2/1999 | Todokoro et al. | |
| 5,874,735 A | 2/1999 | Matsumoto et al. | |
| 5,900,629 A | 5/1999 | Todokoro et al. | |
| 6,069,356 A | 5/2000 | Todokoro et al. | |
| 6,078,382 A * | 6/2000 | Nakasuji | 355/55 |
| 6,084,238 A | 7/2000 | Todokoro et al. | |
| 6,107,633 A | 8/2000 | Frosien et al. | |
| 6,239,430 B1 * | 5/2001 | Weimer et al. | 250/305 |
| 6,376,839 B1 * | 4/2002 | Hayles et al. | 250/311 |
| 6,380,546 B1 * | 4/2002 | Petrov et al. | 250/396 R |
| 6,531,698 B1 * | 3/2003 | Benner | 250/311 |
| 6,566,658 B1 | 5/2003 | Okubo | |
| 6,747,279 B1 * | 6/2004 | Adamec | 250/396 ML |
| 6,787,772 B1 * | 9/2004 | Ose et al. | 250/310 |
| 6,858,843 B1 * | 2/2005 | Mankos et al. | 250/310 |
| 6,885,001 B1 * | 4/2005 | Ose et al. | 250/310 |
| 6,943,360 B1 * | 9/2005 | Mankos | 250/492.2 |
| 6,956,211 B1 * | 10/2005 | Sato et al. | 250/310 |
| 2001/0010357 A1 * | 8/2001 | Ose et al. | 250/311 |
| 2003/0089859 A1 * | 5/2003 | Adamec | 250/396 ML |
| 2003/0168606 A1 * | 9/2003 | Adamec et al. | 250/396 R |
| 2004/0173746 A1 * | 9/2004 | Petrov et al. | 250/310 |
| 2004/0188612 A1 * | 9/2004 | Ose et al. | 250/310 |
| 2005/0116164 A1 * | 6/2005 | Goldenshtein et al. | 250/311 |
| 2005/0139773 A1 * | 6/2005 | Ose et al. | 250/311 |

FOREIGN PATENT DOCUMENTS

| | | |
|---|---|---|
| JP | 58-147948 | 9/1983 |
| JP | 62-219446 | 9/1987 |
| JP | 09-171791 | 6/1997 |
| JP | 11-067130 | 3/1999 |
| JP | 411067130 | 3/1999 |
| JP | 11-120950 | 4/1999 |

* cited by examiner

FIG.1

FIG. 2A
DEFLECTING FORCE PRODUCED IN THE VICINITY OF THE OBJECTIVE

FIG. 2B
CANCELLATION OF DEFLECTING FORCE

FIG. 2C
CANCELLATION BY ELECTRIC FIELD

FIG. 2D
CANCELLATION BY MAGNETIC FIELD

SCANNING ELECTRON MICROSCOPE

This application is a continuation of application Ser. No. 10/817,834 filed Apr. 6, 2004 now U.S. Pat. No. 6,885,001, which is a continuation of application Ser. No. 09/768,356 filed Jan. 25, 2001 now U.S. Pat. No. 6,787,772.

BACKGROUND OF THE INVENTION

The present invention relates to a scanning electron microscope that scans the surface of a specimen with an electron beam and forms a two-dimensional electron image representing the shape or composition of the surface of the specimen through the detection of secondary signals produced by the specimen. More particularly, the present invention relates to a scanning electron beam microscope suitable for forming electron beam images of a high resolution at a high throughput by rapidly moving an observation point to tens of test positions on a semiconductor wafer as a specimen.

A scanning electron microscope (hereinafter abbreviated to "SEM") accelerates electrons emitted by an electron source of a heating electron emission type or a field electron emission type, collimates the accelerated electrons in a fine electron beam, i.e., a primary electron beam using an electrostatic lens or a magnetic field lens, scans a specimen two-dimensionally with the primary electron beam, detects secondary electrons generated by the specimen irradiated with the primary electron beam or secondary signal electrons, i.e., reflected electrons, and forms a two-dimensional electron image by applying intensities of detection signals as brightness modulating inputs to a cathode-ray tube (abbreviated to "CRT") that is scanned in synchronism with a scanning operation using the primary electron beam.

Device miniaturization has progressively advanced in the semiconductor industry in recent years, and optical microscopes for inspection in semiconductor device fabricating processes and test processes have been replaced by SEMs. The SEM uses an electron beam for dimension measurement and testing electrical operations. When observing an insulating specimen, such as a wafer that is used in the semiconductor industry, is observed with a SEM, a low acceleration voltage of 1 kV or below must be used not to charge the insulating specimen. Generally, the resolution of a general SEM using a low acceleration voltage of 1 kV is about 10 nm. As the miniaturization of semiconductor devices advances, demand for SEMs capable of forming images in a high resolution by using a low acceleration voltage has increased. A retarding system and a boosting system were developed and proposed in, for example, Japanese Patent Laid-open No. Hei 9-171791 to meet such demand. Those previously proposed systems enable observation in a resolution of about 3 nm under optimum conditions for observation.

SUMMARY OF THE INVENTION

When a SEM is used for the inspection of a semiconductor device during semiconductor device fabricating processes or a completed semiconductor device, capability of rapidly moving an observation point to tens of inspection positions on a semiconductor wafer is a prerequisite of the SEM for the improvement of the throughput of an inspection process. Therefore, a stage capable of rapid movement has been used. However, the positioning accuracy of the stage is on the order of several micrometers. Mechanical control of the position of the stage in an accuracy on the order of nanometers is economically infeasible and is practically difficult in respect of moving speed. Therefore, to position the stage in a high accuracy higher than several micrometers, there is adopted an image shifting system that shifts electrically the coordinates of the scanning center of a primary electron beam. In some cases, since the coordinates are shifted by a distance as long as several micrometers, the image shifting system employed in the conventional SEM deteriorates resolution when the distance of shift is great.

According to the present invention it is an object of the present invention to provide a SEM capable of image shifting an image without causing significant deterioration of resolution.

With the foregoing object in view, the present invention provides a SEM comprising: an electron source, an image shifting deflector system including two deflectors disposed respectively at upper and lower stages to shift an irradiation position of a primary electron beam emitted by the electron source on a specimen; and an objective that focuses the primary electron beam; wherein the objective has a lens gap opening toward the specimen, and the deflectors disposed at the lower stage on the side of the specimen forms a deflecting electric field in a region corresponding to an effective principal plane of the objective.

DESCRIPTION OF THE PREFERRED EMBODIMENTS

Figure 1:
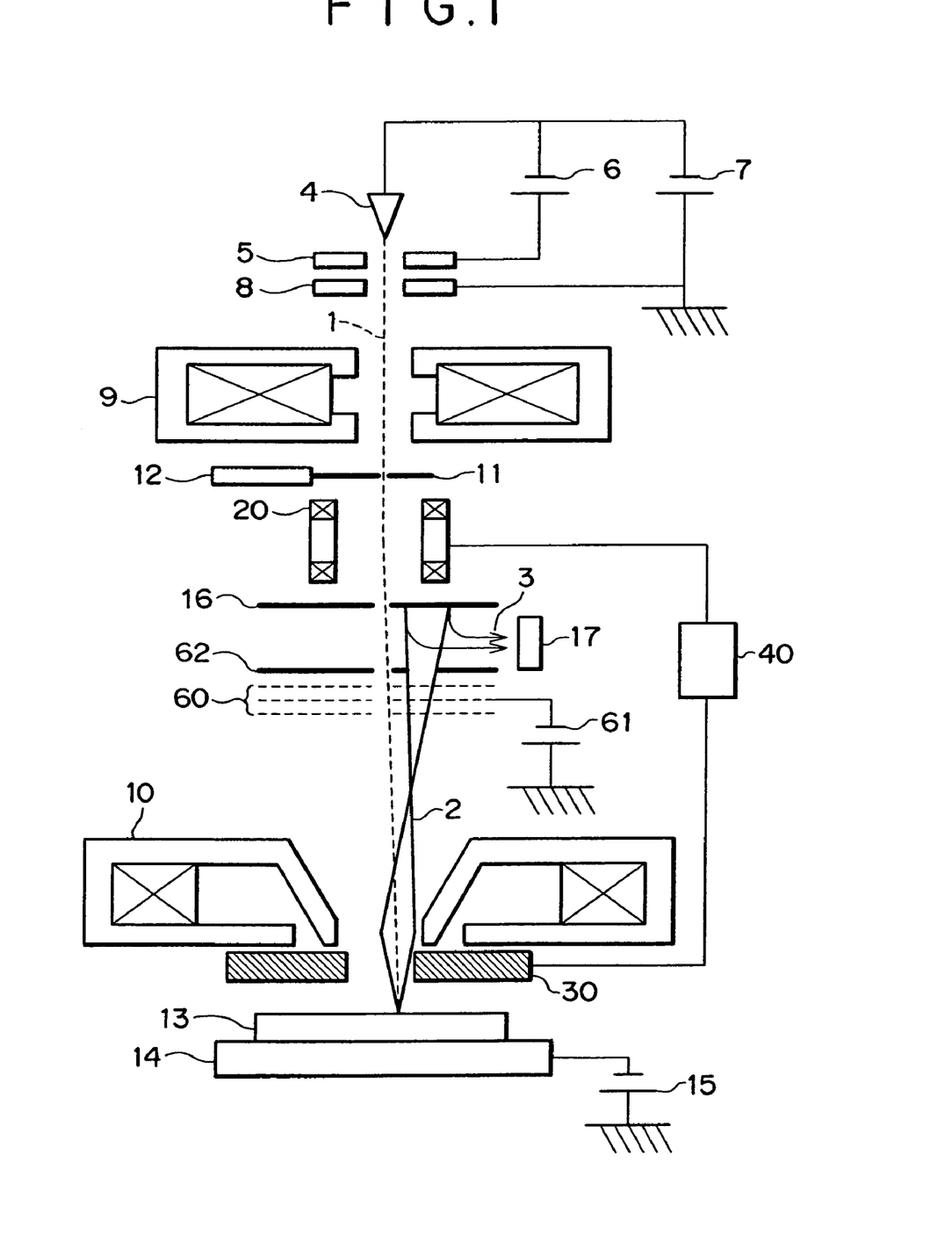
FIG. 1 is an overall, schematic view of a SEM in a preferred embodiment according to the present invention provided with an image shifting deflector of a lower stage provided with an electrostatic deflecting electrode.

FIG. 1 shows a SEM in a first embodiment according to the present invention. A cathode 4 emits electrons when a beam voltage 6 is applied across the cathode 4 and an emission control electrode 5. The electrons thus emitted are accelerated (decelerated in some cases) by the emission control electrode 5 and an anode 8 held at a ground voltage. An acceleration voltage for accelerating a primary electron beam 1 is equal to an electron gun acceleration voltage 7. The primary electron beam 1 accelerated by the anode 8 is gathered by a condenser lens 9. Angle of divergence of the primary electron beam 1 or beam current is determined by a diaphragm 11 disposed below the condenser lens 9. A knob 12 is operated for centering the diaphragm 11.

The primary electron beam 1 having passed the diaphragm 11 is deflected by image shifting deflectors 20 and 30 having a scanning deflection function for image shifting, and is moved on a specimen 13 for two-dimensional scanning. The deflecting intensities of the deflectors 20 and 30 are adjusted so that the primary electron beam 1 travels straight through an objective 10. A deflection function for scanning and an image shift deflecting function are provided by simultaneously applying a scanning deflection component and an image shifting deflection component to the deflectors 20 and 30 by a deflection control power supply 40 to input the deflecting intensities of the deflectors 20 and 30.

A focusing magnetic field created by the objective acts on the primary electron beam 1 so as to deflect the primary electron beam 1 in directions perpendicular to the direction of travel of the primary electron beam 1 to deflect the primary electron beam for image shifting so that the primary electron beam deviates greatly from the optical axis of the objective 10. Thus, the deflection of the primary electron beam 1 causes off-axis aberration. Such off-axis aberration can be suppressed by a deflector that deflects the primary electron beam 1 so as to cancel deflection caused by the objective 10. However, disposition of a deflector in the objective 10 is subjected to many physical restrictions. This SEM employs the objective 10 having a lens gap opening toward the specimen, i.e., an objective having a lower magnetic pole having an aperture greater than that of an upper magnetic pole and capable of creating a maximum focusing magnetic field in the vicinity of the specimen disposed below the objective. Thus, the effective principal plane of the objective is positioned on a level different from that of the objective or on a level that places only few physical restrictions to facilitate the disposition of an electrostatic deflecting electrode. The SEM shown in FIG. 1 has an optical system of a short overall length because only the deflector 20 needs to be disposed between the condenser lens 9 and the objective 10.

The primary electron beam 1 is decelerated by a decelerating electric field created between the objective 10 and the specimen 13 by applying a negative retarding voltage 15 through a stage 14 to the specimen 13 and is collimated by the collimating action of the objective 10.

In this embodiment, the upper deflector 20 is a magnetic deflector and the lower deflector 30 is an electrostatic deflector. The upper deflector 20 may be an electrostatic deflector. Similarly, the lower deflector 30 may be a magnetic deflector. However, since only a narrow space is available in the vicinity of the objective 10, it is proper to use an electrostatic deflector as the lower deflector 30.

Image shifting deflecting intensity $I_{IS}$ given to the upper deflector 20 by the deflection control power supply 40 is expressed by the following expression.

$$I_{IS} = K_1 \frac{\sqrt{V_{acc}}}{LM_{sem}}$$

where $K_1$ is conversion coefficient for converting deflection sensitivity, $M_{SEM}$ is the magnification of the SEM, $V_{acc}$ is acceleration voltage for accelerating the primary electron beam 1, L is the distance between the upper deflector 20 and the specimen 13. Image shifting deflecting intensity $V_{IS}$ given to the lower deflector 30 is expressed by the following expression.

$$V_{IS} = K_2 I_{IS}$$

where $K_2$ is conversion coefficient for converting deflection sensitivity. The angle between the direction of a magnetic field created by the upper deflector 20, i.e., a magnetic deflector, and that of an electric field created by the lower deflector 30, i.e., an electrostatic deflector, is about 90°. This angle between the directions differs from 90° when a magnetic field is created above the objective 10. This angle can be previously determined by numerical simulation or experiments.

Secondary signal electrons 2 are generated when the specimen 13 is irradiated with the primary electron beam 1. The secondary signal electrons 2 include secondary electrons and reflected electrons. The electric field created in a space between the objective 10 and the specimen 13 acts as an acceleration electric field on the secondary signal electrons 2. Therefore, the secondary signal electrons 2 are attracted to the electron beam passing aperture of the objective 10. The secondary signal electrons 2 travel upward being subjected to the focusing action of the magnetic field of the objective 10. The secondary signal electrons having high energy collide against a conversion electrode 16, whereby secondary electrons 3 are emitted. A positive high voltage of about 10 kv is applied to a scintillator 17. The scintillator 17 attracts (deflects) the secondary electrons 3 and emits light. A secondary electron detector, not shown, that detects secondary electrons guides the light emitted by the scintillator 17 by a light guide to a photomultiplier, the photomultiplier converts the light into a corresponding electric signal, the electric signal is amplified and the amplified electric signal is used for the brightness modulation of a CRT.

Figure 9:
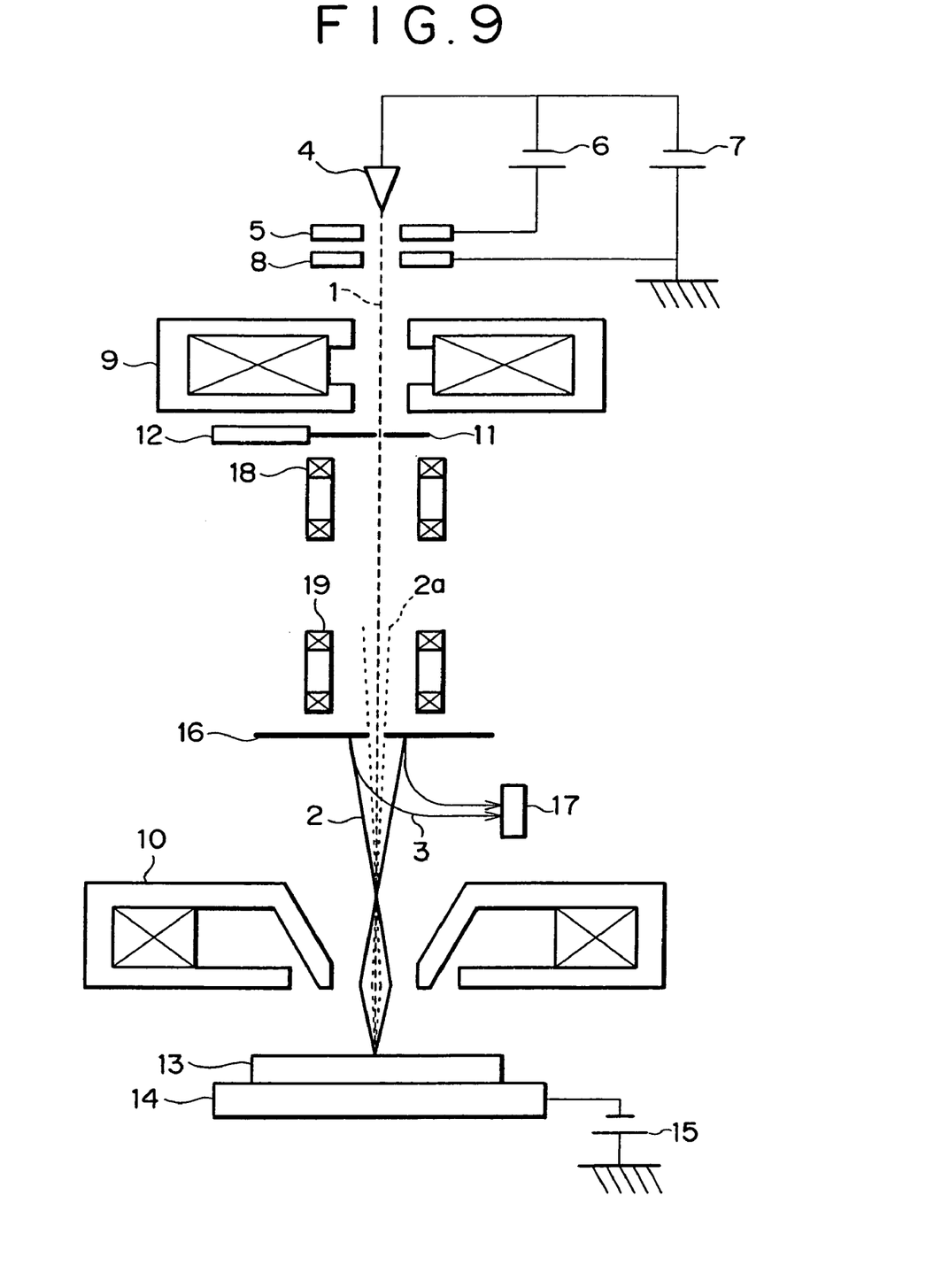
FIG. 9 is a view of assistance in explaining the irregularity of brightness when a specimen is observed by a SEM in a high magnification.
Figure 10:
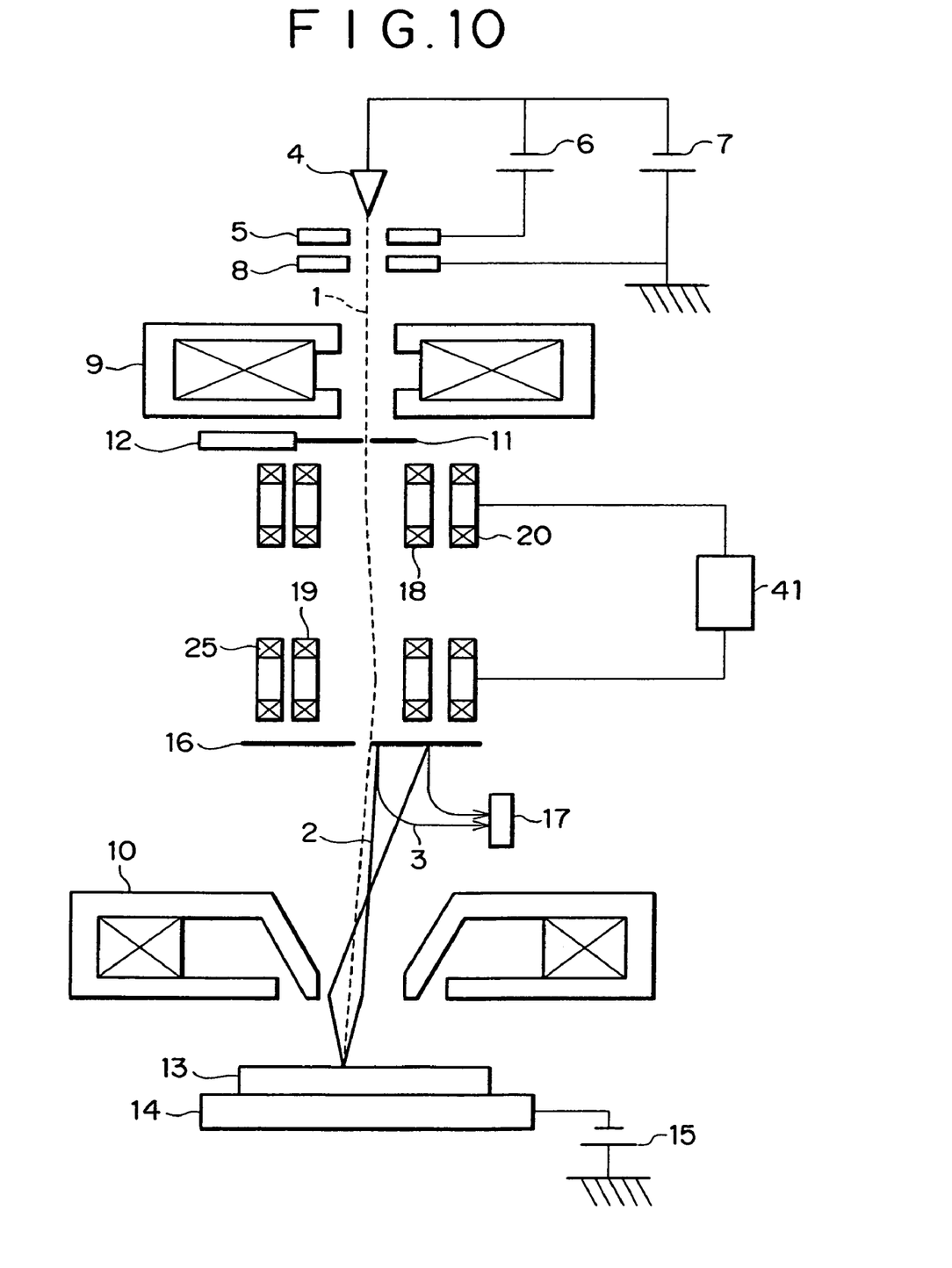
FIG. 10 is a schematic view of assistance in explaining a path of secondary electrons when an image is shifted in a SEM.

The principle and advantages of the SEM in this embodiment will be specifically described with reference to FIGS. 2, 9 and 10. FIG. 9 shows a general SEM for semiconductor wafer inspection, and paths of secondary electrons. FIG. 9 shows an observation mode in which the specimen 13 is observed at a high magnification and image shifting is not used. In this observation mode, the primary electron beam 1 falls on the specimen 13 at a position very close to the optical axis and hence the high-energy accelerated secondary electrons 2 fall in regions near the optical axis on the conversion electrode 16. Since the conversion electrode 16 is provided with a central aperture through which the primary electron beam 1 passes, some secondary electrons 2a travel through the central aperture of the conversion electrode 16 and are not detected. Consequently, an image having irregular brightness is formed. FIG. 10 shows an observation mode in which the specimen 13 is observed at a high magnification and image shifting is used. Secondary electrons 2 emitted from a position to which an image is shifted pass through a retarding electric field, not shown, and the objective 10, and travel along a path slightly deviating from the optical axis and fall in a region not including the central aperture on the conversion electrode 16.

Since the range of deflection of the primary electron beam 1 is limited by the central aperture of the conversion electrode 16, the central aperture of the conversion electrode 16 cannot be excessively reduced. The diameter of the central aperture of the conversion electrode 16 is, for example, 3 mm. Since the optical magnification of the objective 10 is, for example, 50×, an image shifting distance, for example, on the order of 60 µm is necessary to enable the secondary electrons fall in regions not including the central aperture on the conversion electrode 16. On the other hand, ordinary image shifting deteriorates resolution by off-axis aberration when the image shifting distance is greater than 10 µm. Therefore, it is difficult to observe an image of a high resolution when image shifting is executed.

Figure 2A:
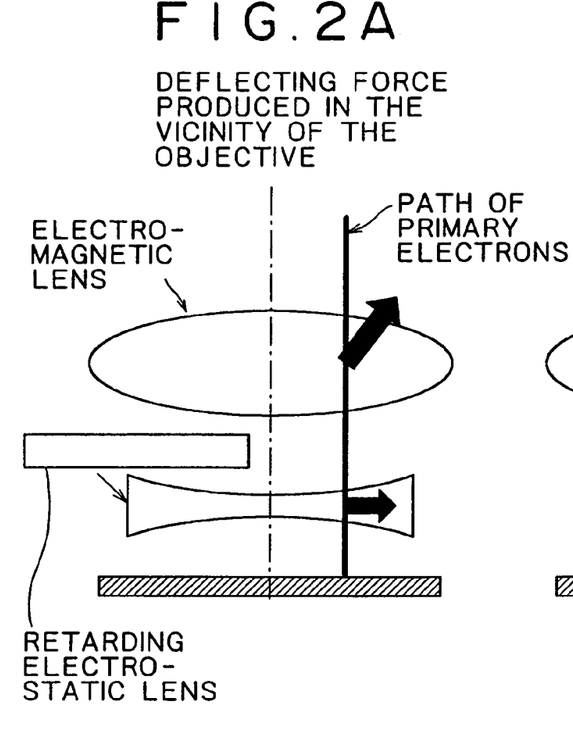
FIGS. 2(a), 2(b), 2(c), and 2(d) are a diagrammatic view of the assistance in explaining deflecting force and a conception of deflecting force cancellation at the time of image shifting.
Figure 2B:
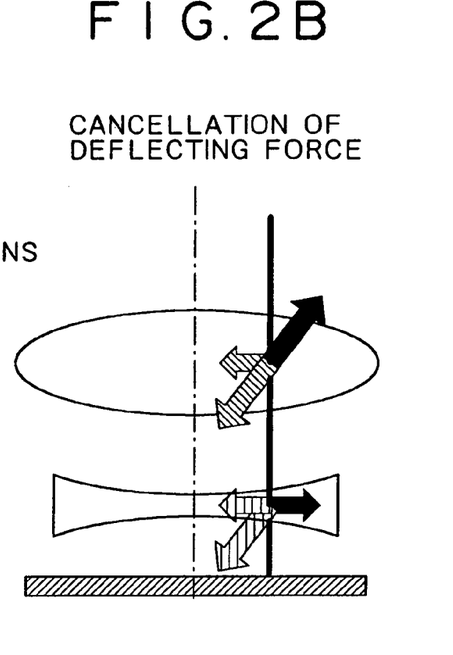
Figure 2C:
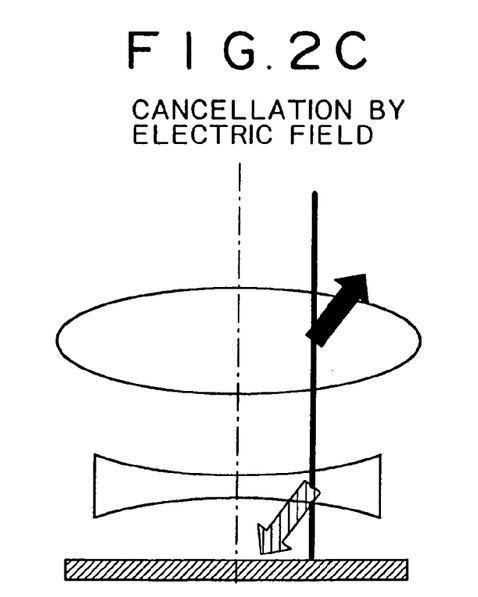
Figure 2D:
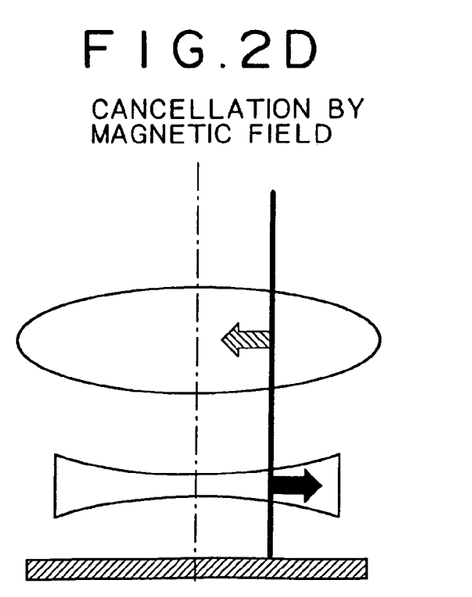

The SEM in this embodiment employs a multipole electrostatic deflector as the lower image shifting deflector and forms the electrostatic deflector on the effective principal plane of the objective to achieve the efficient detection of the secondary electrons without causing significant deterioration of resolution, even if an image shifting amount is great. In the SEM shown in FIG. 1, a magnetic lens is formed by the objective 10 and an electrostatic lens is formed by the retarding voltage 15 applied to the specimen 13 in the vicinity of the specimen 13. Although the magnetic and the electrostatic lens are shown separately in FIG. 2, actually, the magnetic and the electrostatic lens are superposed. FIG. 2A shows deflecting forces exerted by the magnetic and the electrostatic lens on the primary electrons traveling along an off-axis path. The deflecting force FB0 of the objective acts in a rotating direction and the deflecting force FE0 of the electrostatic lens acts in a radial direction. The deflecting force FB0 is always greater than the deflecting force FE0 (FB0>FE0). FIG. 2B shows the so-called moving objective that cancels deflecting forces by superposing lateral deflecting electric field FE1 and a magnetic field FB1 on the lens electric field and magnetic field. Since the deflecting forces are cancelled individually, i.e., FB0+FB1=0 and FE0+FE1=0, off-axis aberration is suppressed to the least extent. FIG. 2C shows the cancellation of deflecting force only by the deflecting electric field. Deflecting force acting on the primary electrons can be cancelled by: FB0+FE2=0 and FE0+FB1=0. Since the secondary electrons travel in the reverse direction, the deflecting force of the magnetic field is reversed. Generally, FB0+FE2=2×FE0 and FE0+FE1=0, and a comparatively large deflecting force remains. FIG. 2D shows the cancellation of the deflecting force only by superposition of the deflecting magnetic field. For the primary electrons, FB0+FB1=0 and FE0+FE1=0. For the secondary electrons, the deflecting force of the magnetic field is reversed because the secondary electrons travel in the reverse direction. Generally, FB0+FE2=0 and FE0+FB2=2× FE0, and a comparatively small deflecting force remains. As obvious from FIGS. 2A to 2D, the superposition of the deflecting electric field shown in FIG. 2C is advantageous to meet both the elimination of the off-axis aberration of the primary electrons and the deflection of the secondary electrons.

When observing an image with the image shifted by a fixed distance on the basis of the foregoing principle by the SEM in this embodiment, the secondary electrons 2 are caused to travel along a path extending apart from the optical path so that most of the secondary electrons fall in a region not including the central aperture of the conversion electrode 16 on the conversion electrode 16, to suppress off-axis aberration due to image shifting and to improve secondary electron detecting efficiency. In some cases, image shifting deflection improves the secondary electron detecting efficiency in a SEM employing the retarding technique and it is desirable to set an observation point with awareness of such a fact.

It is possible to prevent the secondary electrons from passing the central aperture of the conversion electrode 16 by disposing an energy filter 60 including a plurality of layers of meshes below the conversion electrode 16 with respect to the traveling direction of the primary electron beam, whereby energy discriminating ability is improved. In the SEM in this embodiment, a secondary electron detector, not shown, may be interposed between the energy filter 60 and the objective 10 to catch all the secondary electrons that collide against the meshes of the energy filter 60 and do not reach the conversion electrode 16.

When there is not any retarding electric field or the retarding electric field is sufficiently small, only the reflected electrons pass the electron beam passing aperture of the objective 10. The reflected electrons have high energy. Positions at which the reflected electrons fall on the conversion electrode 16 are dependent on angle at which the electrons are reflected by the specimen 13 and energy of the reflected electrons. Therefore, information represented by the selected reflected electrons can be obtained in a high sensitivity by disposing an aperture filter 62 below the conversion electrode 16 with respect to the traveling direction of the primary electron beam. When the reflected electrons reflected in a substantially perpendicular direction are selected, an image of high contrast of a specimen having a specific atomic number can be observed in a high resolution. In the conventional SEM, the path of the reflected electrons and the path of the primary electrons overlap each other and hence the detection of the reflected electrons is difficult.

Substantially the same effect can be expected by making only a part of the conversion electrode 16 emit secondary electrons instead of employing the aperture filter 62. In such a case, it is preferable to coat the conversion electrode 16 excluding a part of the same with carbon that emit secondary electrons at a low efficiency.

Figure 3:
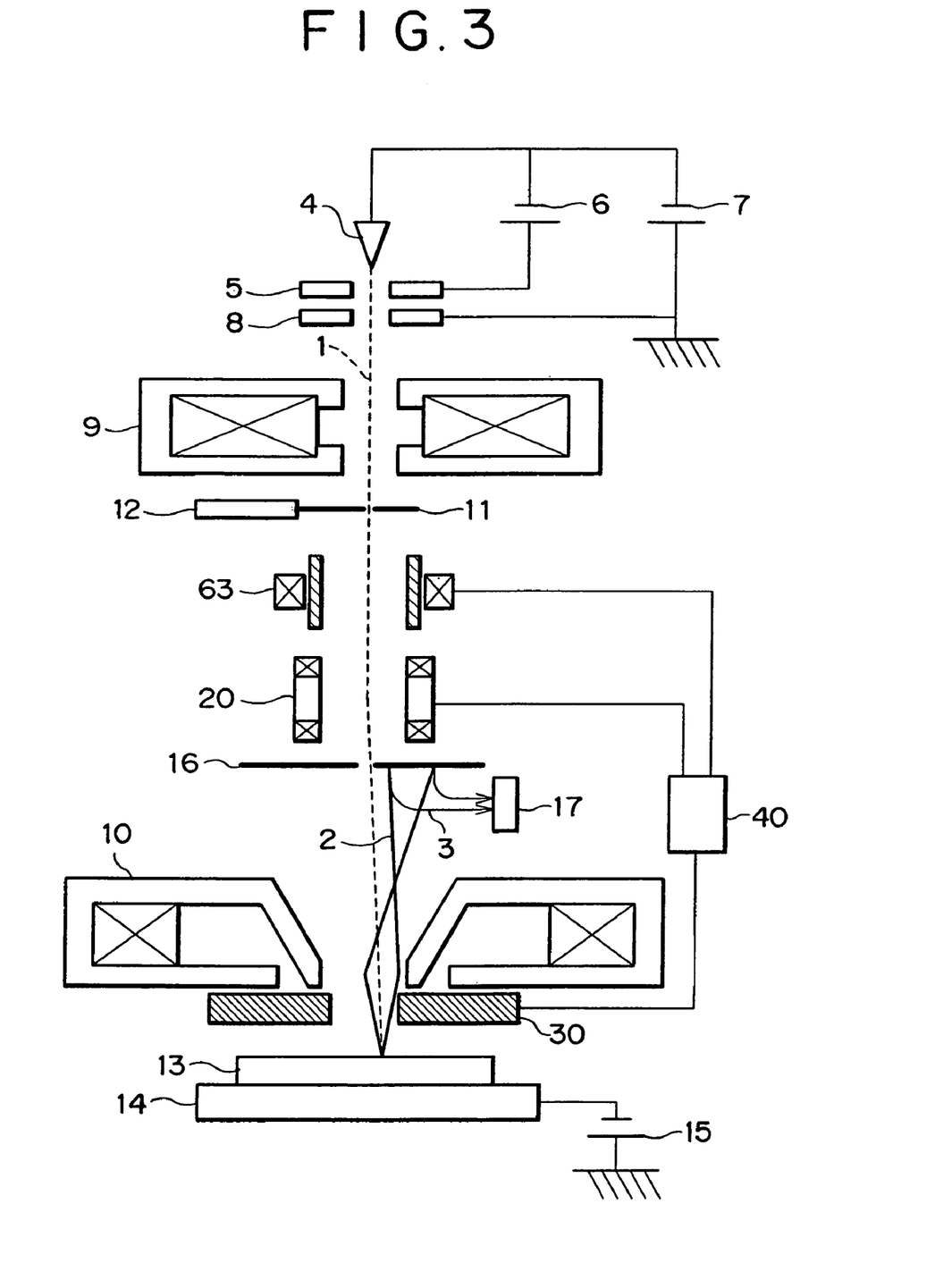
FIG. 3 is an overall, schematic view of a SEM provided with a Wien filter that nullifies the off-axis chromatic aberration.

FIG. 3 shows a SEM in a second embodiment according to the present invention. In the SEM in the first embodiment, the objective 10 cause slight off-axis aberration because deflecting force is exerted on the secondary electrons 2. The off-axis aberration is a significant problem that affects adversely to observation in a high resolution. In the third embodiment, a Wien filter 62 adjusted so as to cancel off-axis aberration caused by an objective 10 is disposed on the side of an electron source with respect to a conversion electrode 16 to avoid the problem attributable to off-axis aberration.

Figure 4:
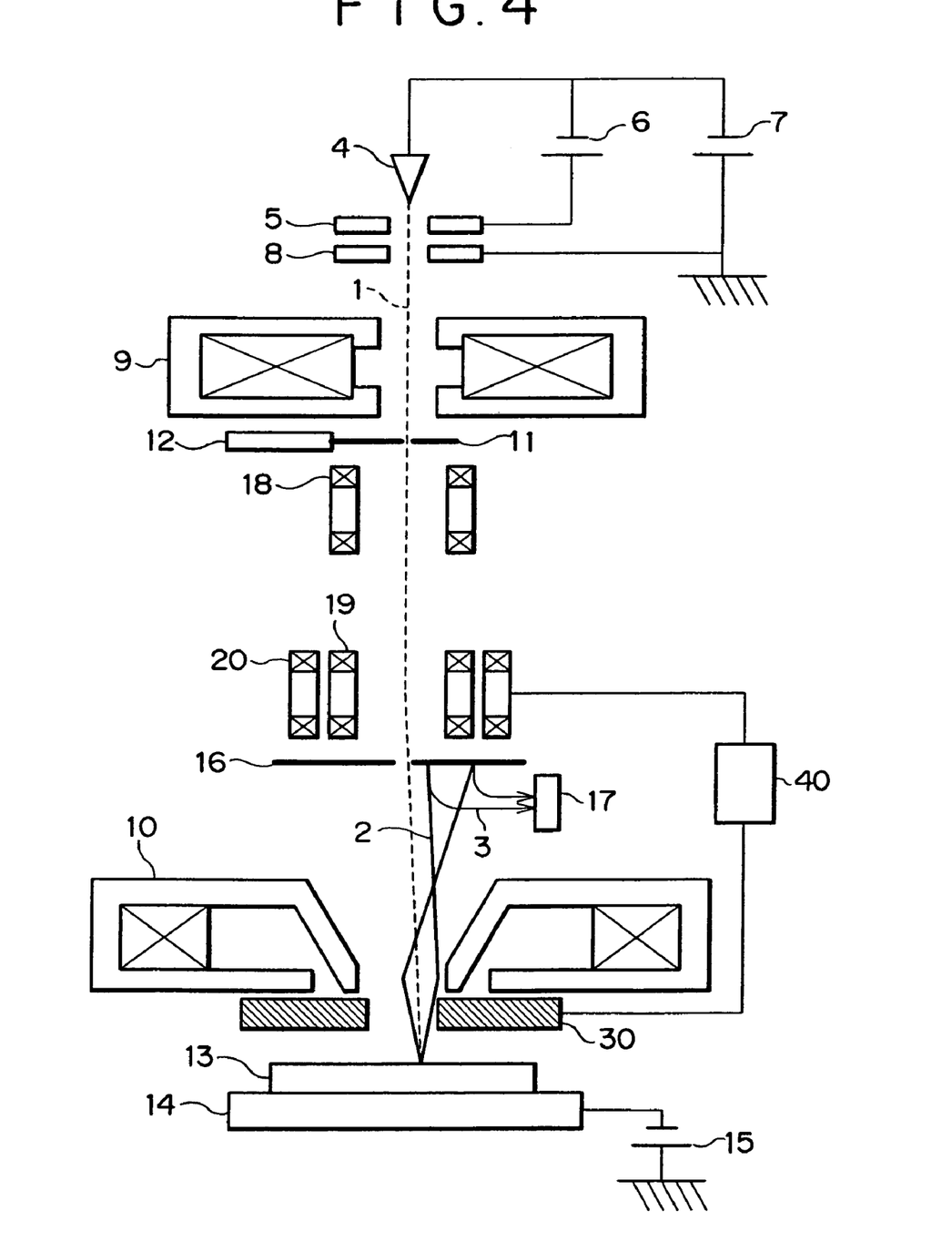
FIG. 4 is an overall, schematic view of a SEM additionally provided with an image shifting deflector according to the present invention.

FIG. 4 shows a SEM in a third embodiment according to the present invention. The SEM in the third embodiment is provided with, in addition to two scanning deflectors 18 and 19 of a general SEM disposed at two stages, image shifting deflectors 20 and 30 in accordance with the present invention. A primary electron beam 1 traveled through a diaphragm 11 is deflected for two-dimensional scanning on a specimen 13 by the scanning deflectors 18 and 19. A deflection control power supply 40 gives a deflecting intensity $I_{IS}$ corresponding to a shifting distance to the upper image shifting deflector 20 for image shifting and gives a deflecting intensity $V_{IS}$ adjusted so as to make a primary electron beam 1 travel straight through an objective 10 to the lower image shifting deflector 30.

Thus, the image shifting deflectors 20 and 30 can be easily incorporated into the general SEM to improve image shifting function, resolution and accuracy of dimensional measurement.

Figure 5:
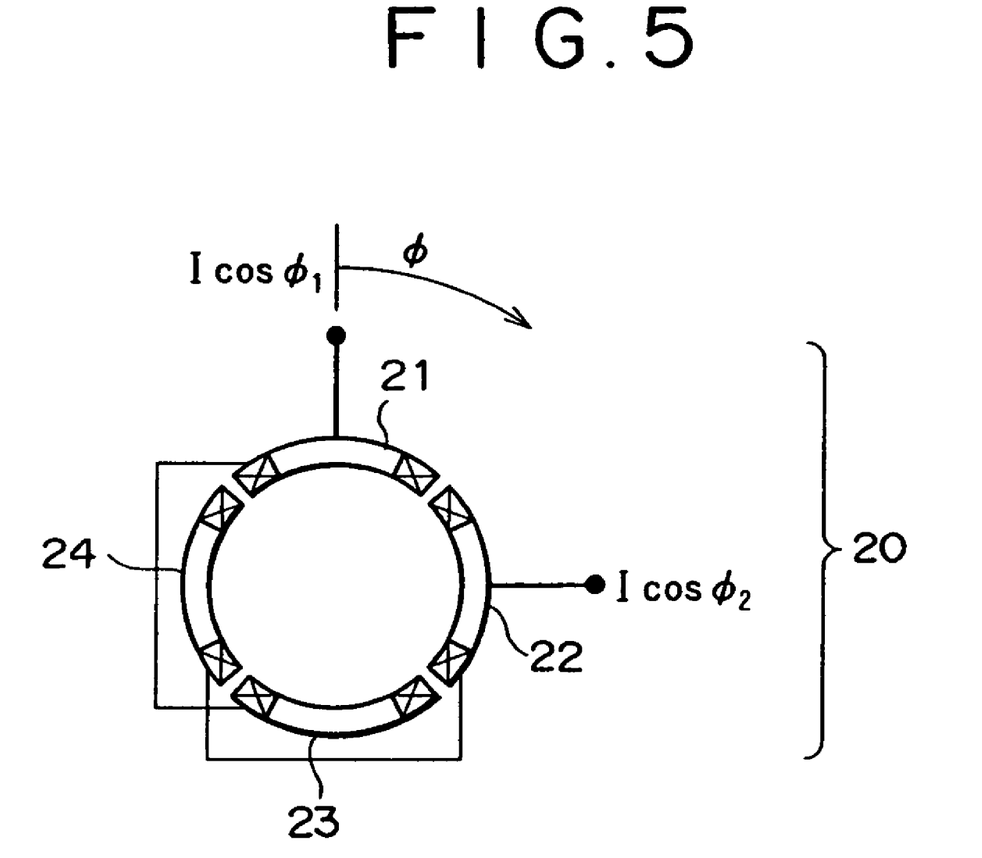
FIG. 5 is a top plan view of an image shifting deflector of an upper-stage according to the present invention.

The image shifting deflectors 20 and 30 will be described with reference to FIGS. 4 and 5. The upper image shifting deflector 20 is the same in construction as a conventional scanning deflector. The upper image shifting deflector 20 has scanning coils 21 to 24 are cosine distributed winding coils to create a uniform deflecting magnetic field around the optical axis of the SEM. The four quadrant coils are disposed in a circle. Coil currents are regulated in proportion to the cosine of the angle $\phi$ between an electron beam deflecting direction and the position of the scanning coils to deflect the primary electron beam 1 in a desired direction. Usually, currents of the same absolute value and opposite directions are supplied to the opposite scanning coils 21 and 23, respectively. Therefore, currents can be supplied to both the scanning coils 21 and 23 from a single power supply by connecting the scanning coils 21 and 23 to the power supply in opposite ways of connection, respectively. Similarly, currents can be supplied to the opposite scanning coils 22 and 24 by a single power supply.

Figure 6:
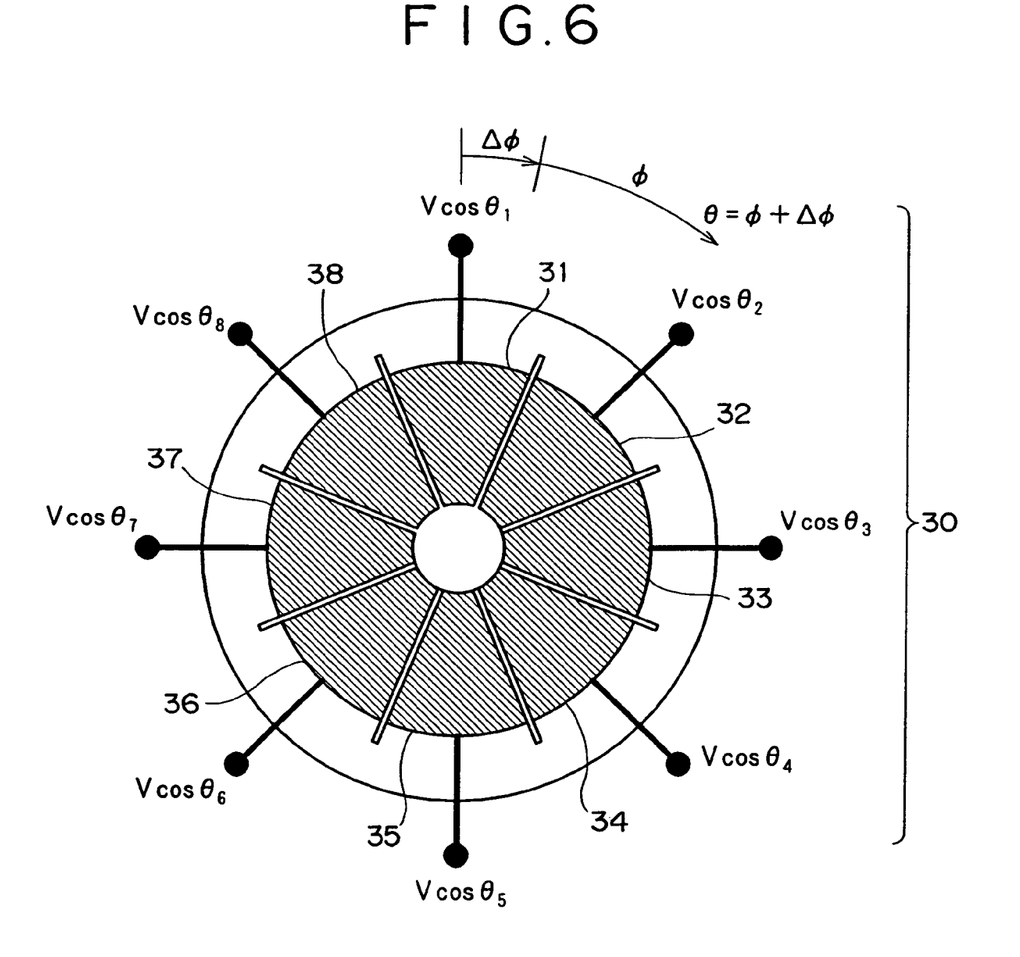
FIG. 6 is a top plan view of an octupole electrostatic deflector employed as an image shifting deflector at a lower stage in the present invention.

The lower image shifting deflector 30 is an octupole electrostatic deflector. Since the lower image shifting deflector 30 is disposed in a narrow space between the objective 10 and the specimen 13, the lower image shifting deflector 30 is formed in the shape of a disk. Although the octupole electrostatic deflector can be constructed by assembling eight ⅛ electrode sectors, the octupole electrostatic deflector is formed by the following method to assemble the same in a high accuracy and to reduce assembling costs. An electron beam passing aperture is formed in an insulating disk of several millimeters in thickness. Insulating slits are formed in the insulating disk so as to extend radially from the electron beam passing aperture. Eight electrostatic deflecting electrodes 31 to 38 are formed by coating the front and the back surface of a part of the disk around the electron beam passing aperture and the side surfaces of the electron beam passing aperture and the insulating slits with a conductive material by a vapor deposition process or a plating process. Voltages to be applied to the electrodes 31 to 38 are regulated in proportion to the cosine of the angle $\theta$ between an electron beam deflecting direction and the position of the electrodes 31 to 38 to deflect an electron beam by a desired distance in a desired direction. An angular displacement $\Delta\phi$ corresponds to the angle of rotation of a primary electron beam caused by a lens magnetic field created in a space between the upper image shifting deflector 20 and the lower image shifting deflector 30.

Figure 7:
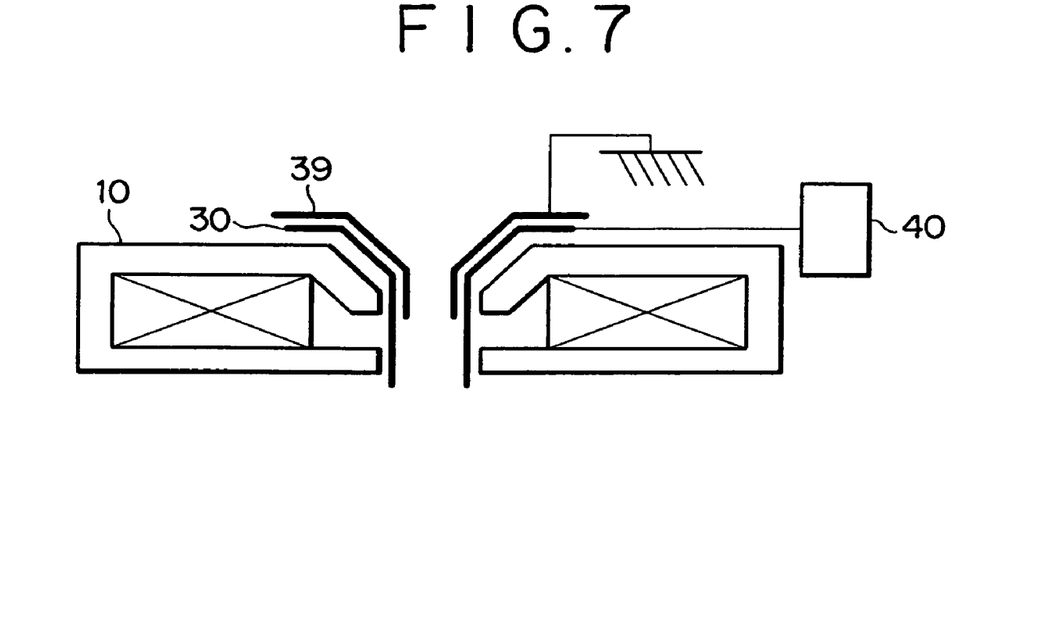
FIG. 7 is a schematic view of an image shifting deflector employed in a SEM in a second embodiment according to the present invention.
Figure 8:
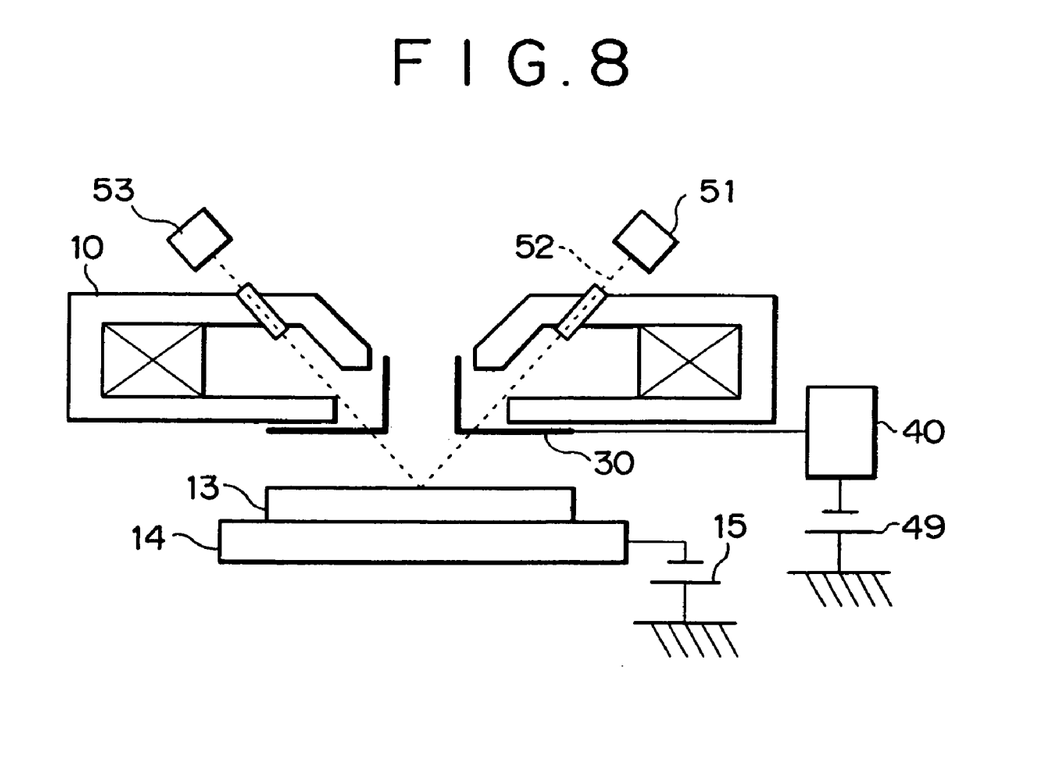
FIG. 8 is a schematic view of an image shifting deflector employed in a SEM in a third embodiment according to the present invention.

FIGS. 7 and 8 show lower image shifting deflectors 30 suitable for use in combination with an objective 10 having a principal plane on a level above the bottom surface of the objective 10, i.e., a level in the electron beam passing aperture of the objective 10. The lower image shifting deflector 30 shown in FIG. 7 has a funnel-shaped insulating base plate and the base plate is inserted from above the objective 10 in the electron beam passing aperture. A head part of the insulating base plate is divided into eight divisions and coated with a conductive material by the foregoing method. A shielding electrode 39 prevents the charging effect of an insulating part of the lower image shifting deflector 30 and the creation of a deflecting electric field in a region not affected by an objective magnetic field. The lower image shifting deflector 30 shown in FIG. 8 is inserted from below an objective 10 in an electron beam passing aperture formed in the objective 10. The insulating base plate of the lower image shifting deflector 30 has a flat, annular peripheral part and a cylindrical central part extending from a central portion of the peripheral part. The peripheral part and the central part of the base plate are divided into eight divisions, and coated with a conductive material by the foregoing method. In some cases, the cylindrical part is extended not only toward the objective 10 but also toward the specimen 13 according to the distribution of the objective magnetic field. A deflection control power supply 40 applies a voltage to the lower image shifting deflector 30 relative to a ground potential to deflect an electron beam. The surface electric field of the specimen 13 can be adjusted by off-setting a reference potential by a power supply 49, which is effective in charging and adjusting surface potential for the observation of an insulating specimen. The lower image shifting deflector 30 can be easily installed also when the SEM is provided with a height measuring device that measures the height of the specimen 13 by using a laser beam. A laser light source 51 projects a laser beam 52 obliquely to the specimen 13. The laser beam 52 reflected by the specimen 13 is detected by a position sensor 53. The position of the reflected laser beam 52 on the position sensor 53 varies according to the height of the specimen 13. The variation of the height of the specimen 13 is determined through the measurement of the variation of the position of the reflected laser beam 52 on the position sensor 53. The lower image shifting deflector 30, i.e., the octupole electrostatic deflector, can be easily disposed so that the laser beam 52 and the reflected laser beam 52 may pass the insulating slits of the lower image shifting deflector 30.

In the SEM in this embodiment, the upper image shifting deflector deflects the electron beam off the optical axis taking the Lorentz force of the objective into consideration, and the lower image shifting deflector executes electrostatic deflection of the electron beam so that the axial deviation of the electron beam by the Lorentz force may be suppressed and the electron beam travels straight toward the specimen. Therefore, off-axis aberration due to a large angle of deflection of the electron beam can be suppressed and resolution can be improved.

Since an electrostatic deflector is used as the lower image shifting deflector disposed between the lower magnetic pole of the objective of an open lower magnetic pole type and the specimen, the electron beam can be deflected without increasing the short focal length of the objective.

The SEM in this embodiment reduces aberration by employing the objective having a short focal length and reduces off-axial aberration by controlling the angle of deflection for image shifting.

Figure 11:
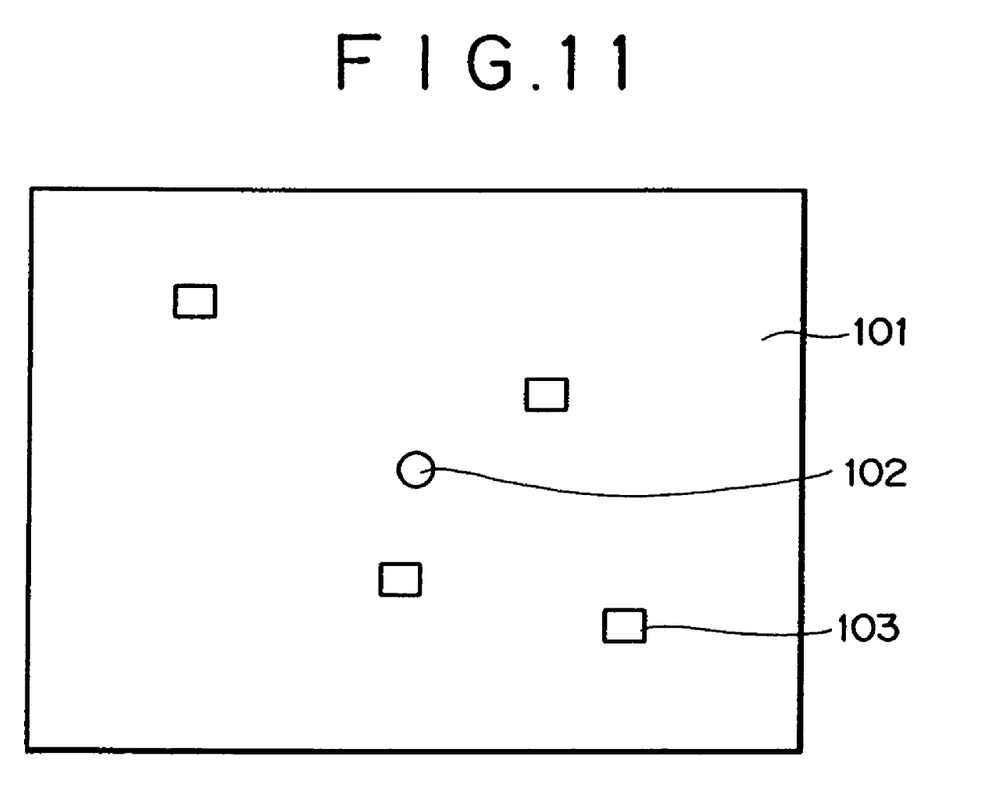
FIG. 11 is a typical view of a deflection range of an image shifting deflector.

FIG. 11 is a view of assistance in explaining a SEM in a fourth embodiment according to the present invention. FIG. 11 shows typically a deflection range 101 for image shifting. The SEM as shown in FIG. 1 is provided with a controller, not shown. The controller sets values of parameters including observation positions and magnification, and controls a mirror included in the SEM on the basis of the set values. A SEM for inspecting semiconductor wafers needs to observe a plurality of points on the surface of a semiconductor wafer. Recipe specifying conditions for the observation of the plurality of points are set beforehand or the recipe is set manually.

A plurality of high-magnification observation regions 103 can be set in the deflection range 101 in which the electron beam is deflected by image shifting deflectors 20 and 30. As mentioned above, most secondary electrons from a central point 102 of the deflection range 101, i.e., a point corresponding to a primary electron beam 1, pass through the aperture of a conversion electrode 16, and an image of a specimen, having irregular brightness is formed. It is desirable to provide the SEM with a sequence that inhibits setting of a high-magnification observation region 103 at the center 102 of the deflection range 101. For example, when the SEM is provided with a sequence that sets a desired high-magnification observation region among low-magnification images, the foregoing problem can be prevented by making the setting of a high-magnification observation region 103 at the center 102 of the deflection range impossible or by generating a warning requesting moving the stage and resetting the high-magnification observation region 103. When the SEM is provided with recipe specifying operations for multiple-point observation, it is desirable to specify conditions for controlling the stage so that the high-magnification observation region 102 may not be located at the center of the deflection range, to generate a warning when conditions are set so as to locate the high-magnification observation region 102 at the center of the deflection region or to inhibit the setting of such conditions. The operator is able to carry out operations for setting the high-magnification region at a position other than the center of the deflection range 101 without depending on warnings or the like when a typical image of the deflection region 101 of the image shifting deflectors as shown in FIG. 11 is displayed on the screen of a display, not shown.

The SEM in this embodiment is able to form an image of a high resolution and to measure dimensions in a high accuracy even if the distance of image shifting is great. In particular, in semiconductor device fabricating processes that process a wafer having a large area and provided with very minute circuit elements, the SEM is able to achieve precision inspection at a high throughput.

What is claimed is:

1. A scanning electron microscope comprising:
   an electron source;
   a magnetic field type objective lens for focusing a primary electron beam emitted from the electron source on a specimen and having a lens gap opening toward the specimen;
   a first deflector for deflecting the primary electron beam off-axis of the objective lens; and
   a second deflector, comprising an electrostatic deflector, for deflecting the primary electron beam, so that a deflecting force of the objective lens against the primary electron beam is canceled when the primary electron beam is deflected off-axis of the objective lens,
   wherein the second deflector creates an electric field that suppresses off-axis deviation of the primary electron beam being caused by a magnetic field created by the objective lens.

2. The scanning electron microscope according to claim 1, wherein the first deflector serves also as a scanning deflector for scanning the primary electron beam.

3. The scanning electron microscope according to claim 1, wherein the second deflector is an octupole deflector.

4. The scanning electron microscope according to claim 3, wherein:
   the octupole deflector has an insulating base plate provided with a primary electron beam passing aperture and insulating slits formed so as to extend radially from the electron beam passing aperture, and
   opposite surfaces of a part of the base plate around the electron beam passing aperture and side surface of the electron beam passing aperture and the insulating slits are coated with conductive films.

5. The scanning electron microscope according to claim 4, wherein:
   the insulating base pate has a conductive, cylindrical part formed around the primary electron beam passing aperture, and
   the conductive, cylindrical part of the insulating base plate is inserted in a primary electron beam passing aperture of the objective lens.

6. The scanning electron microscope according to claim 3, wherein:
   the octupole deflector has a part inserted in a primary electron beam passing aperture of the objective lens, and
   a shielding electrode is disposed so as to screen partly a deflecting electric field created by the octupole deflector.

7. A scanning electron microscope comprising:
   an electron source;
   a magnetic field type objective lens for focusing a primary electron beam emitted from the electron source on a specimen and having a lens gap opening toward the specimen;
   a first deflector for deflecting the primary electron beam off-axis of the objective lens; and
   a second deflector, comprising an electrostatic deflector, for deflecting the primary electron beam, so that an aberration created by a deflecting force of the objective lens against the primary electron beam is cancelled when the primary electron beam is deflected off-axis of the objective lens,
   wherein the second deflector creates an electric field that suppresses off-axis deviation of the primary electron beam being caused by a magnetic field created by the objective lens.

8. The scanning electron microscope according to claim 7, wherein the first deflector serves also as a scanning deflector for scanning the primary electron beam.

9. The scanning electron microscope according to claim 7, wherein the second deflector is an octupole deflector.

10. The scanning electron microscope according to claim 9, wherein:
    the octupole deflector has an insulating base plate provided with a primary electron beam passing aperture and insulating slits formed so as to extend radially from the electron beam passing aperture, and
    opposite surfaces of a part of the base plate around the electron beam passing aperture and side surface of the electron beam passing aperture and the insulating slits are coated with conductive films.

11. The scanning electron microscope according to claim 10, wherein:
    the insulating base plate has a conductive, cylindrical part formed around the primary electron beam passing aperture, and
    the conductive, cylindrical part of the insulating base plate is inserted in a primary electron beam passing aperture of the objective lens.

12. The scanning electron microscope according to claim 9, wherein:
    the octupole deflector has a part inserted in a primary electron beam passing aperture of the objective lens, and
    a shielding electrode is disposed so as to screen partly a deflecting electric field created by the octupole deflector.

* * * * *